(12) United States Patent  (10) Patent No.: US 8,111,485 B2
Freeman et al.  (45) Date of Patent: Feb. 7, 2012

(54) ARM MOUNTED SHOCK SENSOR AND FLEXIBLE CIRCUIT ROUTING

(75) Inventors: Rick Pfahl Freeman, Northfield, MN (US); Neal Frank Gunderson, Lake Elmo, MN (US); Andrew Robert Motzko, Delano, MN (US); Erik Jon Lindquist, Oakdale, MN (US)

(73) Assignee: Seagate Technology LLC, Cupertino, CA (US)

( * ) Notice: Subject to any disclaimer, the term of this patent is extended or adjusted under 35 U.S.C. 154(b) by 670 days.

(21) Appl. No.: 12/273,838

(22) Filed: Nov. 19, 2008

(65) Prior Publication Data

US 2010/0123976 A1 May 20, 2010

(51) Int. Cl.
*G11B 5/55* (2006.01)
(52) U.S. Cl. ............... 360/264.2; 360/264.1; 360/75
(58) Field of Classification Search ........... 360/264.2, 360/264.1, 75, 78
See application file for complete search history.

(56) References Cited

U.S. PATENT DOCUMENTS

| | | |
|---|---|---|
| 5,095,396 A | 3/1992 | Putnam |
| 5,526,208 A | 6/1996 | Hatch et al. |
| 5,555,619 A | 9/1996 | Maggio et al. |
| 5,570,250 A | 10/1996 | Casey |
| 5,583,720 A | 12/1996 | Ishida et al. |
| 5,631,788 A | 5/1997 | Richards |
| 5,644,452 A | 7/1997 | Cox et al. |
| 5,680,277 A | 10/1997 | Bonn et al. |
| 5,717,541 A | 2/1998 | Ycas et al. |
| 5,923,501 A | 7/1999 | Suzuki et al. |
| 6,166,874 A | 12/2000 | Kim |
| 6,480,362 B1 | 11/2002 | Yoshida et al. |
| 6,583,964 B1 | 6/2003 | Huang et al. |
| 6,888,694 B2 | 5/2005 | Guo et al. |
| 6,934,126 B1 | 8/2005 | Berding et al. |
| 6,937,442 B2 | 8/2005 | Zhao et al. |
| 6,977,790 B1 * | 12/2005 | Chen et al. .............. 360/75 |

\* cited by examiner

*Primary Examiner* — Huan Hoang
(74) *Attorney, Agent, or Firm* — Leanne Teveggia Farrell; Westman, Champlin & Kelly, P.A.

(57) ABSTRACT

An actuator for supporting data transfer elements includes an arm, a flexible circuit assembly and a sensor. The flexible circuit assembly includes a stiffener having a mount feature and a turnaround feature. The flexible circuit assembly also includes a flexible cable having a plurality of conductive traces for electrically connecting the data transfer elements to circuitry. The flexible cable has a service loop portion, a mounting portion coupled to the mount feature of the stiffener and a turnaround portion coupled to the turnaround feature of the stiffener. The turnaround portion is configured to couple the mounting portion to the service loop portion. The sensor is in contact with a surface of the arm and is electrically coupled to the flexible cable.

17 Claims, 8 Drawing Sheets

ARM MOUNTED SHOCK SENSOR AND FLEXIBLE CIRCUIT ROUTING

BACKGROUND

A typical data electronics enclosure includes a rigid housing that encloses a variety of components. A data storage system is one type of electronics enclosure. Components in a data storage system include one or more storage media. For example, the storage media can be mounted on a spindle motor that causes the media to spin and the data surfaces of the discs to pass under aerodynamic bearing head sliders. The head sliders are supported on an actuator having at least one arm and at least one corresponding suspension that moves across the media using mechanical energy derived from a voice coil motor. The sliders carry transducers, which write information to and read information from the data surfaces of the media.

A flexible circuit assembly electrically connects the read/write elements on the head slider and the electronics on the actuator to a printed circuit board (PCB) that interfaces with a host computer. The flexible circuit assembly includes a flexible cable that allows pivotal movement of the actuator during operation. The flexible cable includes electrical traces supported by a polymeric carrier material.

As areal densities of the storage media increase, the fly height of the head above the media decreases. It is desirable to measure the zero fly height point for each head and associated media combination to optimize head fly height.

The discussion above is merely provided for general background information and is not intended to be used as an aid in determining the scope of the claimed subject matter.

SUMMARY

An actuator for supporting data transfer elements includes an arm, a sensor in contact with a surface of the arm and a flexible circuit assembly. The flexible circuit assembly includes a stiffener having a mount feature for mounting to the arm and a turnaround feature coupled to the mount feature. The flexible circuit assembly also includes a flexible cable having a plurality of conductive traces for electrically connecting the data transfer elements to circuitry. The flexible cable includes a service loop portion, a mounting portion for mounting to the mount feature of the stiffener and a turnaround portion for mounting to the turnaround feature of the stiffener.

The mounting portion of the flexible cable includes a sensor receiving portion for electrically coupling to the sensor while the sensor is in contact with the surface of the arm. Mounted to the mounting portion of the flexible cable includes a signal processing component for amplifying a signal from the data transfer elements. Besides amplifying a signal from the data transfer elements, the signal processing component also processes a sensed signal from the sensor. The flexible cable electrically couples the sensor to the signal processing component, while the sensor is in contact with the surface of the arm These and various other features and advantages will be apparent from a reading of the following Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

DETAILED DESCRIPTION

Embodiments pertain to flexible circuit assemblies coupled to actuators in electronic devices, such as data storage systems, and the routing of flexible cable of the flexible circuit assemblies to accommodate a sensor coupled to an arm of the actuator. An actuator is configured to support data transfer elements including transducers. In one embodiment, the sensor is configured to measure a zero fly height point for a slider that includes transducers for reading and writing information to a data storage medium. In order for the sensor to achieve the required signal-to-noise ratio, the sensor is mounted to an e-block of an actuator assembly of the electronic device and is located as close as possible to the signal processing component of which can process the resultant signals. Embodiments of the flexible circuit assemblies take into consideration the signal processing component is already coupled to a flexible cable for use in other applications.

Figure 1:
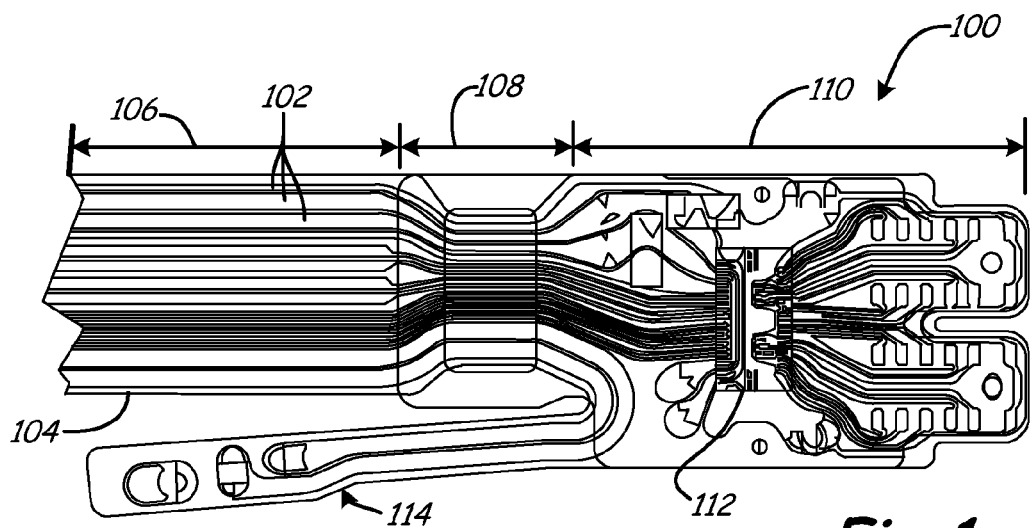
FIG. 1 is a plan view of a related art flexible cable.

FIG. 1 is a plan view of a related art flexible cable 100. Flexible cable 100 allows pivotal movement of an actuator during operation of an electronic device while electrically connecting elements connected to the actuator to a printed circuit board (PCB) that interfaces with a host or host computer. For example, in a data storage system, the actuator accesses locations on a storage medium with transducing elements located on slider(s) to read and write information. Flexible cable 100 includes electrical traces 102 supported by a polymeric carrier material 104. The electrical traces are coupled to the read/write transducing elements on the slider through electronics on the actuator assembly to connect with the PCB that interfaces with the host.

Flexible cable 100 includes a service loop portion 106. Service loop portion is the portion of flexible cable 100 that moves with the actuator and makes the connection between the actuator and the PCB. Flexible cable 100 includes a turnaround portion 108. Turnaround portion 108 orients the position of flexible cable 100. Flexible cable 100 also includes a mounting portion 110 for mounting to an arm of an actuator. Mounted to mounting portion 110 is a signal processing component 112. For example, in a data storage system, signal processing component 112 can be a preamplifier. The preamplifier 112 includes amplification and filtering circuits. More specifically, preamplifier 112 amplifies the signal from the transducing elements that are accessing read/write information on storage media.

Flexible cable 100 also includes a coil tail 114 that separately extends from turnaround portion 108 and includes electrical traces. In a data storage system, coil tail 114 electrically couples to a voice coil motor. The voice coil motor uses electrical energy to produce the mechanical energy needed to actuate arms on an actuator to access locations on the storage media. As illustrated in FIG. 1, a first portion of the polymeric carrier 104 that encompasses coil tail 114 is coupled to a second portion of the polymeric carrier 104 of the turnaround portion 108 in proximity to where turnaround portion 108 couples to mounting portion 110.

Figure 2:
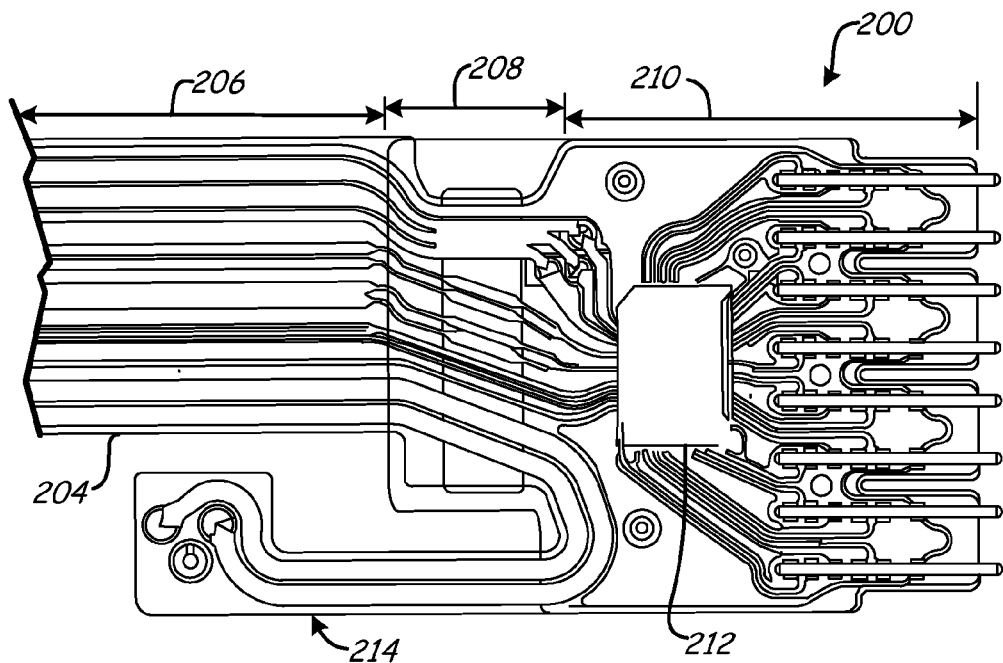
FIG. 2 is a plan view of another related art flexible cable.

FIG. 2 is a plan view of a related art flexible cable 200. Like flexible cable 100, flexible cable 200 includes a service loop portion 206, a turnaround portion 208, a mounting portion 210, signal processing component 212 and coil tail 214. Again, the polymeric carrier 204 that encompasses coil tail 214 separately extends from turnaround portion 208 in proximity to where turnaround portion 208 couples to mounting portion 210.

Figure 3:
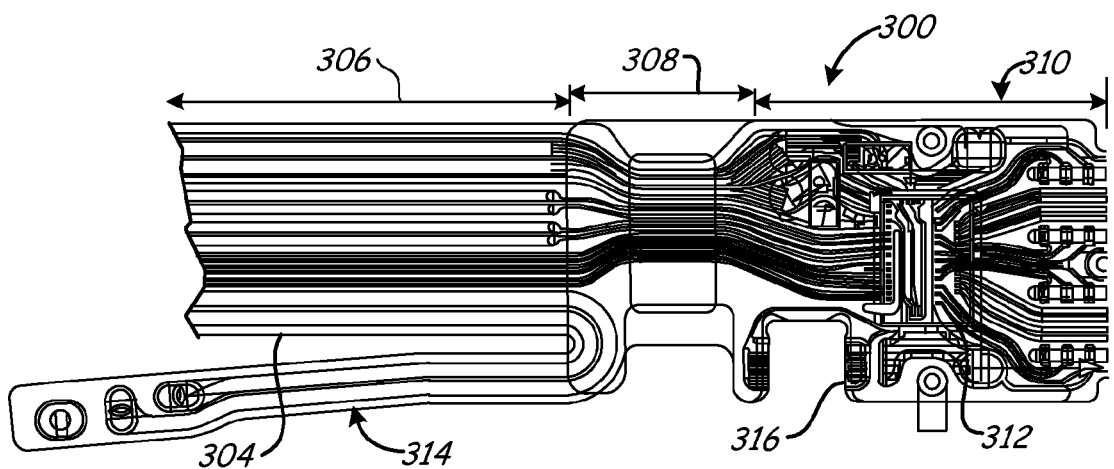
FIG. 3 is a plan view of a flexible cable of a flexible circuit assembly under one embodiment.

FIG. 3 is a plan view of a flexible cable 300 of a flexible circuit assembly under one embodiment. Flexible cable 300 includes a service loop portion 306, a turnaround portion 308, a mounting portion 310, signal processing component 312 coupled to mounting portion 310 and coil tail 314. In the embodiment illustrated in FIG. 3, the polymeric carrier 304 of mounting portion 310 includes a sensor receiving portion 316 for accommodating a sensor that is to be mounted to an arm of an actuator for measuring a zero fly height point of transducing elements on a slider. In the FIG. 3 embodiment, sensor receiving portion 316 is a slot. Slot 316 includes three side edges of the polymeric carrier 304 of mounting portion 310. At least two of the three side edges of polymeric carrier 304 have traces that are configured for electrical connection with the sensor.

To free up space in mounting portion 310 for accommodating a sensor, the polymeric carrier 304 that encompasses coil tail 314 separately extends from turnaround portion 308 in proximity to where turnaround portion 308 couples to service loop portion 306.

Figure 4:
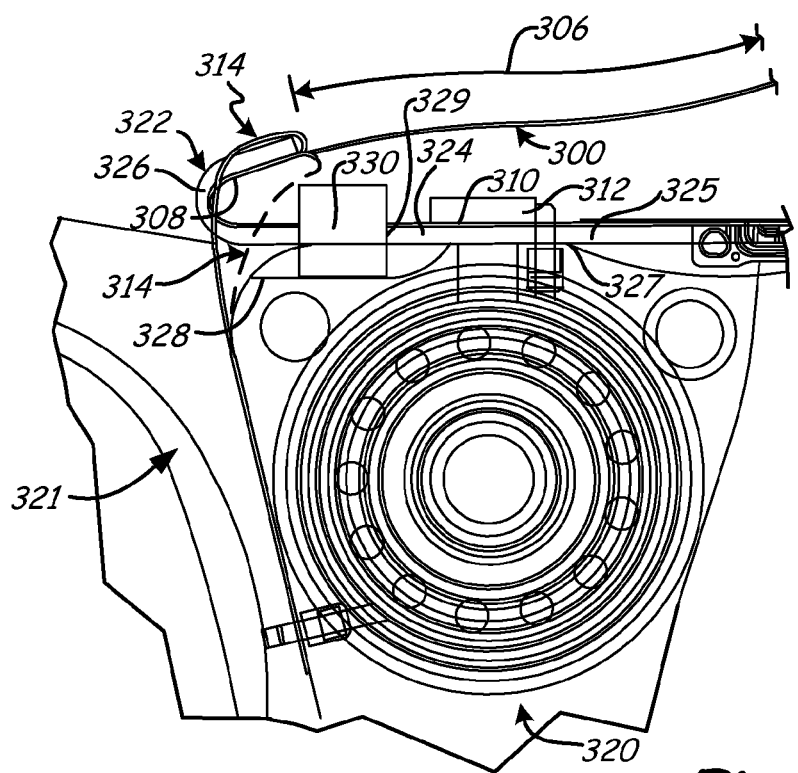
FIG. 4 is a top plan view of a portion of an arm and a flexible circuit assembly including the flexible cable of the embodiment illustrated in FIG. 3.

FIG. 4 is a plan view of a portion of an arm 320, a flexible circuit assembly 322 including flexible cable 300 of the embodiment illustrated in FIG. 3 and a portion of a voice coil motor 321. As illustrated, flexible circuit assembly 322 includes a stiffener 324 and flexible cable 300. Stiffener 324 includes a mount feature 325 for mounting to arm 320 and a turnaround feature 326 coupled to mount feature 325. Mounting portion 310 of flexible cable 300 is mounted to mount feature 325 of stiffener 324 and turnaround portion 308 of flexible cable 300 is mounted to turnaround feature 326 of stiffener 324. Therefore, mount feature 325 of stiffener 324 also includes a slot 329 that matches and is aligned with slot 316 in flexible cable 300. Together slot 329 in stiffener 324 and slot 316 in flexible cable 300 receivingly engage a sensor.

Arm 320 is part of an actuator. A mount surface 327 of arm 320 that receives stiffener 324 includes at least one recess 328. Recess 328 is configured to receive a sensor 330. For example, sensor 330 can be mounted to recess 328 of arm 320 with an adhesive. When implemented in a data storage system, sensor 330 is configured to sense a zero fly height point for transducing elements on a slider that reads and writes information to a data storage medium. Sensor 330 can be a high frequency shock sensor, acoustic emission sensor or other type transducer. Sensor 330 is simultaneously in physical contact with arm 320 and in electrical connection with traces in flexible cable 300 that is supported by stiffener 324. For example, sensor 330 can be soldered to traces in flexible cable 300.

As is illustrated in FIG. 4, sensor 330 is positioned in electrical connection with flexible cable 300 in a position very close to signal processing component 312, which is configured to process the resulting sensed signal. In this way, traces in flexible cable 300 are relatively short between sensor 330 and signal processing component 312 because the components are situated close together. The short distance of traces between sensor 330 and signal processing component 312 provides a suitable signal-to-noise ratio for signal processing.

With coil tail 314 being coupled to turnaround portion 308 in proximity to service loop portion 306, coil tail 314, in one embodiment, can wrap around the exterior of turnaround feature 326 to connect to voice coil motor 321 as is illustrated in FIG. 4. In a different embodiment, coil tail 314 can wrap within an interior of turnaround feature 326 to connect to voice coil motor 321 as is illustrated in dashed lines in FIG. 4.

Figure 5:
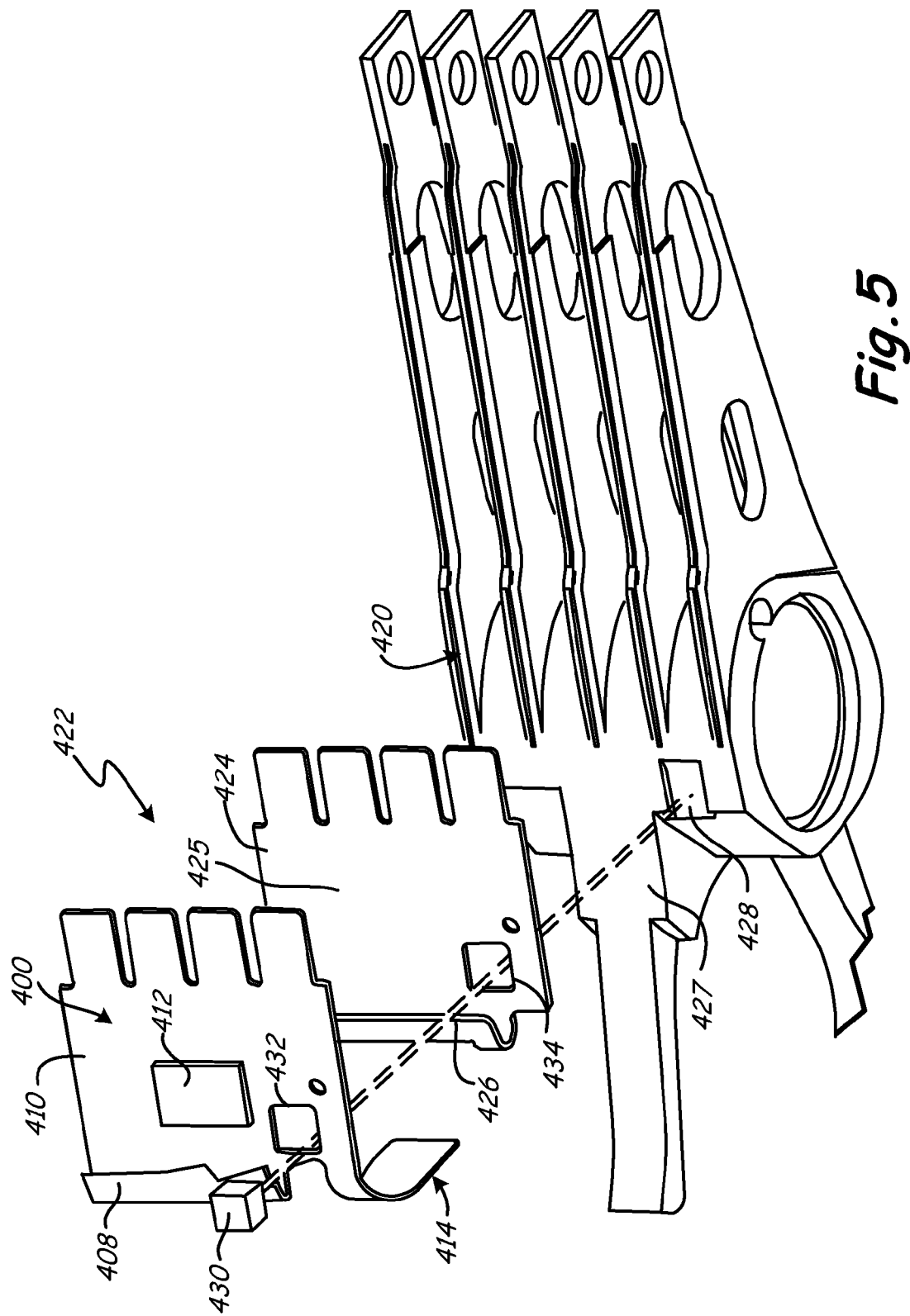
FIG. 5 is an exploded perspective view of an arm and flexible circuit assembly under another embodiment.

FIG. 5 is an exploded perspective view of an arm 420 and flexible circuit assembly 422 under another embodiment. As illustrated, flexible circuit assembly 422 includes a stiffener 424 and flexible cable 400. Stiffener 424 includes a mount feature 425 for mounting to arm 420 and a turnaround feature 426 coupled to mount feature 425. Mounting portion 410 of flexible cable 400 is mounted to mount feature 425 of stiffener 424 and turnaround portion 408 of flexible cable 400 is mounted to turnaround feature 426 of stiffener 424.

In the FIG. 5 embodiment, the mounting portion 410 of flexible cable 400 includes a sensor receiving portion 432. In the FIG. 5 embodiment, sensor receiving portion is a first aperture 432. Mount feature 425 of stiffener 424 includes a second aperture 434. When the mounting portion 410 of flexible cable 400 is mounted to mount feature 425 of stiffener 424, first aperture 432 and second aperture 434 are aligned. When both the stiffener 424 and flexible cable 400 are mounted together and received by arm 420, first aperture 432 and second aperture 434 are aligned together with a recess 428 on arm 420.

A mount surface 427 of arm 420 receives stiffener 424 and includes the at least one recess 428. Recess 428 is configured to receive a sensor 430. Therefore, when assembled, sensor 430 is mounted to recess 428 with, for example, an adhesive, and inserted through first aperture 432 of flexible cable 400 and second aperture 434 of stiffener 424. Traces in flexible cable 400 are located about the circumference of first aperture 432, such that when the first aperture 432 receives sensor 430, the traces are electrically connected with the sensor by, for example, solder paste. However, other types of materials could be used, such as a conductive epoxy. When implemented in a data storage system, sensor 430 is configured to sense a zero fly height point for transducing elements in a slider that reads and writes information to a data storage medium. Sensor 430 can be a high frequency shock sensor, acoustic emission sensor or other type of transducer. As is illustrated in FIG. 5, sensor 430, when assembled, is positioned very close to signal processing component 412, which is configured to process the resulting sensing signal. In this way, traces in flexible cable 400 are relatively short between sensor 430 and signal processing component 412 because the components are situated close together. The short distance of traces between sensor 430 and signal processing component 412 provides a suitable signal-to-noise ratio for signal processing.

A coil tail 414 separately extends from mounting portion 410 in proximity to where turnaround portion 408 couples to a service loop portion (not shown). In one embodiment, coil tail 414 can route directly from the mounting feature to connect to a voice coil motor.

Figure 6:
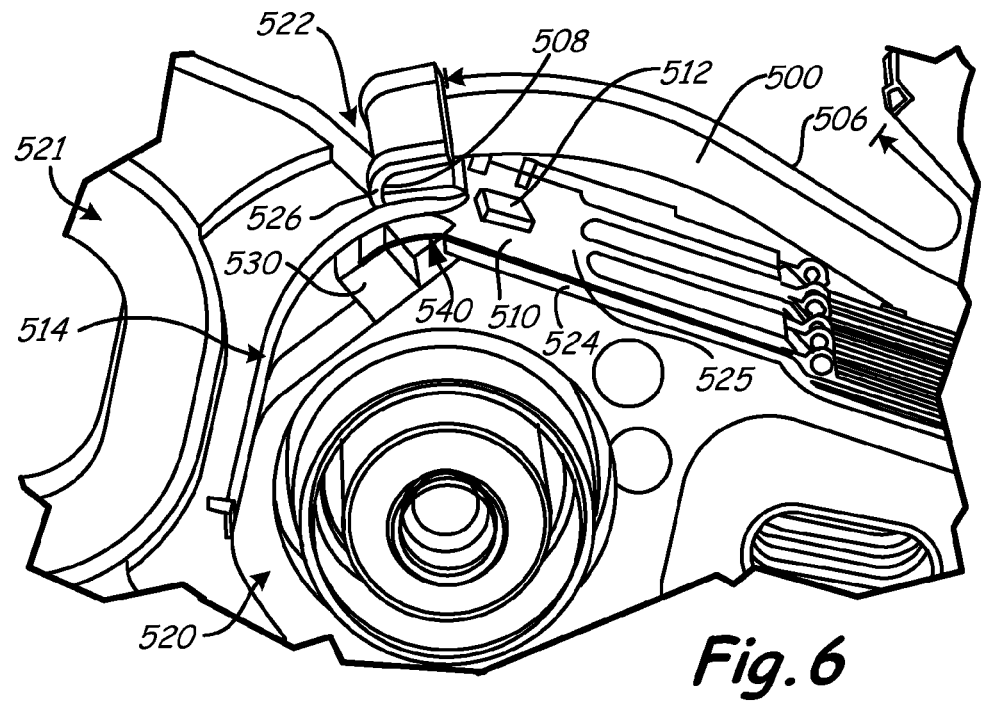
FIG. 6 is a perspective view of a portion of an arm and flexible circuit assembly under yet another embodiment.
Figure 7:
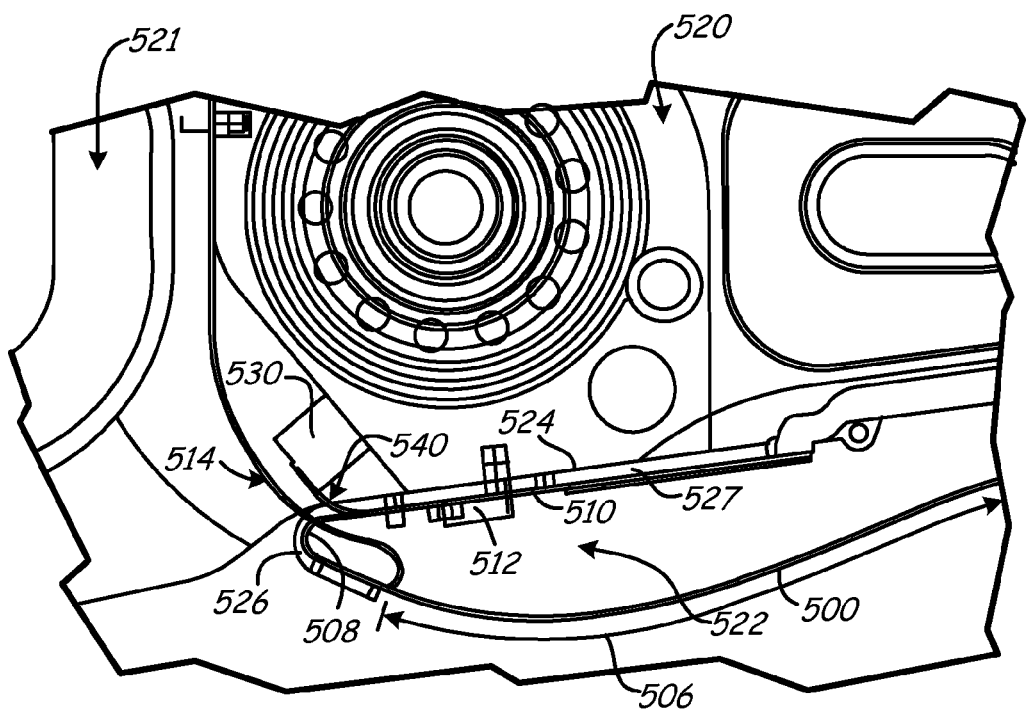
FIG. 7 is top plan view of a portion of the arm and the flexible circuit assembly in the embodiment illustrated in FIG. 6.

FIG. 6 is a perspective view of a portion of an arm 520, a flexible circuit assembly 522 including flexible cable 500 and a portion of a voice coil motor 521. FIG. 7 is a top plan view of a portion of arm 520, the flexible circuit assembly 522 and voice coil motor 521. As illustrated, flexible circuit assembly 522 includes a stiffener 524 and flexible cable 500. Stiffener 524 includes a mount feature 525 for mounting to arm 520 and a turnaround feature 526 coupled to mount feature 525. Mounting portion 510 of flexible cable 500 is mounted to mount feature 525 of stiffener 524 and turnaround portion 508 of flexible cable 500 is mounted to turnaround feature 526 of stiffener 524.

Flexible cable 500 includes a coil tail 514 and a sensor receiving portion 540 in the form of a sensor tail. As illustrated in FIGS. 6 and 7, the polymeric carrier for coil tail 514 separately extends from turnaround portion 508 in proximity to where service loop portion 506 couples with turnaround portion 508. In one embodiment, coil tail 514 can wrap within and above or below the interior of turnaround feature 526 to connect to voice coil motor 521. As illustrated in FIGS. 6 and 7, the polymeric carrier 514 of sensor tail 540 separately extends from mounting portion 508 in proximity to where mounting portion 510 couples with turnaround portion 510. In one embodiment, sensor tail 540 extends from this point to electrically connect with a sensor 530, either on the top or bottom of sensor 530, with, for example, a solder paste. However, other types of materials could be used, such as a conductive epoxy.

Sensor 530 can be a high frequency shock sensor, acoustic emission sensor or other type of transducer. When implemented in a data storage system, sensor 530 is configured to sense a zero fly height point for transducing elements on a slider that read and write information to a data storage medium. As is illustrated in FIGS. 6 and 7, sensor 530 is mounted on a surface of arm 520 and positioned relatively close to signal processing component 512, however, not as close as embodiments illustrated in FIGS. 4-5. Signal processing component 512 is configured to process the resulting sensed signal. In this way, traces in flexible cable 500 are short between sensor 530 and signal processing component 512 because the components are situated relatively close together. The short distance of traces between sensor 350 and signal processing component 512 provides a suitable signal-to-noise ratio for signal processing.

Figure 8:
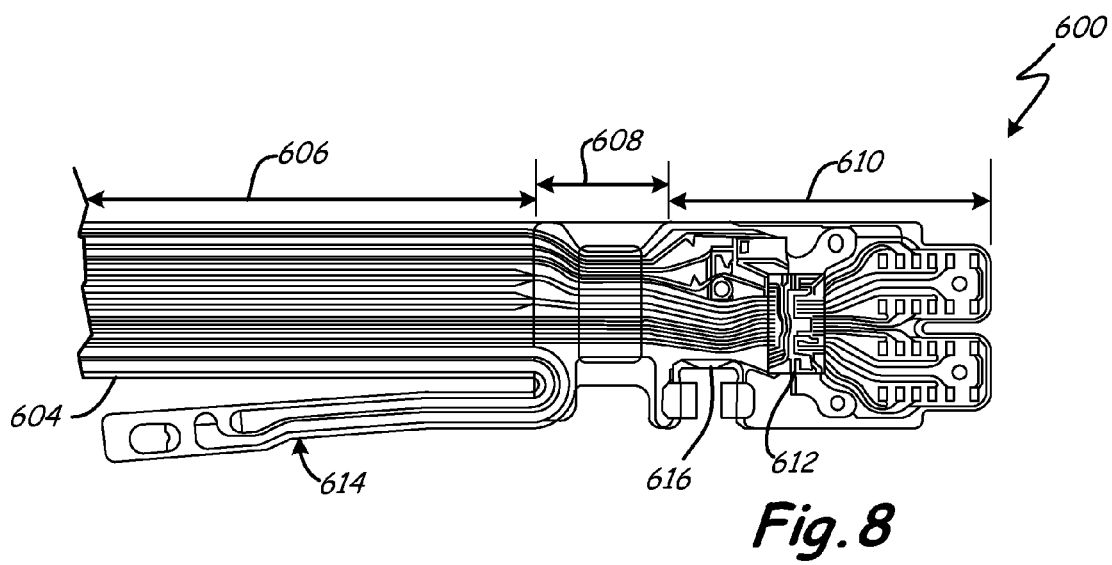
FIG. 8 is a plan view of a flexible cable of a flexible circuit assembly under yet another embodiment.

FIG. 8 is a plan view of a flexible cable 600 of a flexible circuit assembly 622 under yet another embodiment. Flexible cable 600 includes a service loop portion 606, a turnaround portion 608, a mounting portion 610, a signal processing component 612 coupled to mounting portion 610 and a coil tail 614. In the embodiment illustrated in FIG. 8, the polymeric carrier 604 of mounting portion 610 includes a sensor receiving portion 616 for accommodating a portion of an arm that protrudes from its mount surface for mounting a sensor. In a data storage system, the sensor is used for measuring a zero fly height point of transducing element on a slider. In the FIG. 8 embodiment, sensor receiving portion 616 is a slot. Slot 616 includes three side edges of the polymeric carrier 604 of mounting portion 610. At least two of the three side edges of polymeric carrier 304 have traces that are configured for electrically coupling to the sensor by, for example solder or some other electrically conducting material. To free up space in mounting portion 610 for accommodating a sensor, the polymeric carrier 604 that encompasses coil tail 614 separately extends from turnaround portion 608 in proximity to where turnaround portion 608 couples to service loop portion 606.

Figure 9:
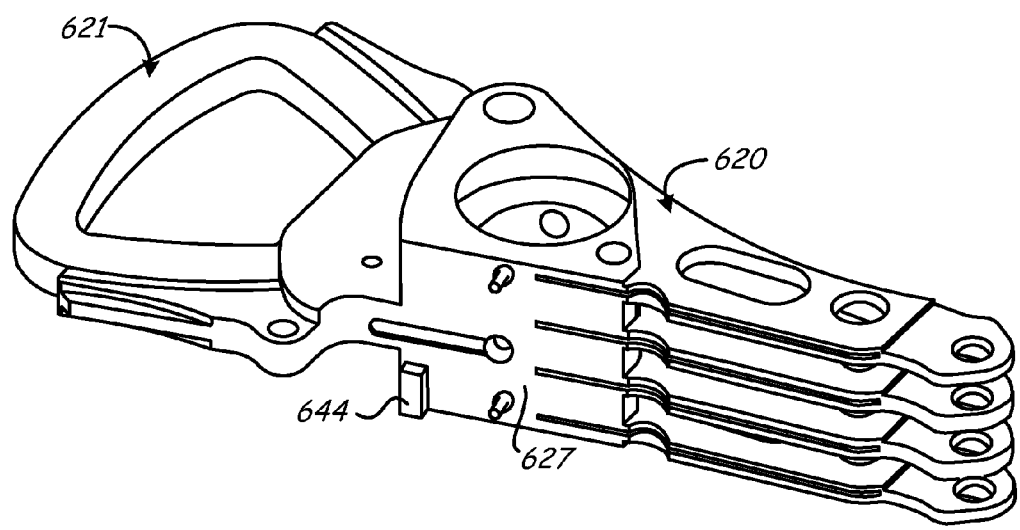
FIG. 9 is a top perspective view of an embodiment of an arm configured to receive the flexible cable illustrated in FIG. 8.

FIG. 9 is a top perspective view of an embodiment of an arm 620 coupled to a voice coil motor 621. Arm 620 is configured to receive a flexible circuit assembly including the flexible cable 600 illustrated in FIG. 8. As illustrated in FIG. 9, arm 620 includes a mount surface 627 that is configured to receive the flexible circuit assembly (illustrated for example in FIGS. 10 and 11). Arm 620 includes a protrusion 644 that protrudes from mount surface 627. As illustrated in FIG. 9, protrusion 644 has a rectangular shape. However, it should be realized that any type of geometrically shaped protrusion that protrudes from mount surface 627 is possible.

Figure 10:
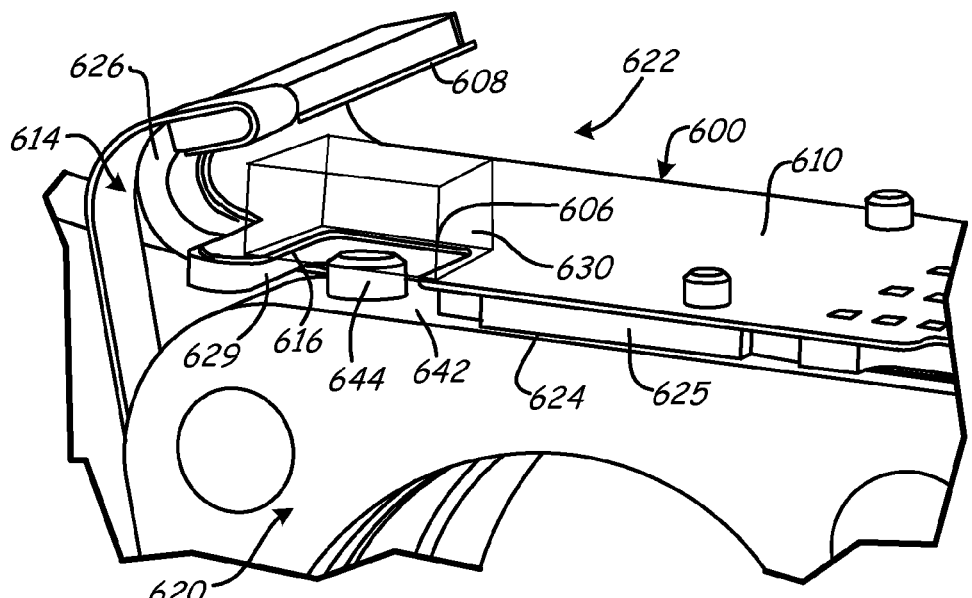
FIG. 10 is a first perspective view of a portion of the arm illustrated in FIG. 9 and a flexible circuit assembly including the flexible cable of the embodiment illustrated in FIG. 8.
Figure 11:
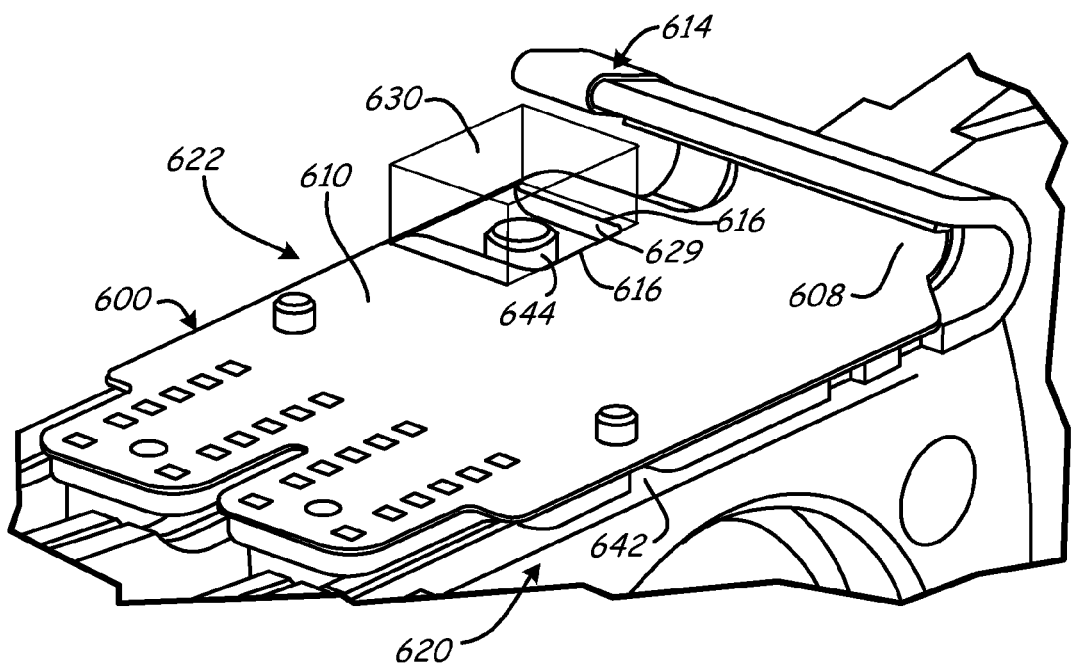
FIG. 11 is a second perspective view of a portion of the arm illustrated in FIG. 9 and a flexible circuit assembly including the flexible cable of the embodiment illustrated in FIG. 8.

FIG. 10 is a first perspective view of a portion of arm 620 illustrated in FIG. 9 and a flexible circuit assembly 622 including the flexible cable 600 of the embodiment illustrated in FIG. 8. FIG. 11 is a second perspective view of the portion of arm 620 and flexible circuit assembly 622. As illustrated in FIGS. 10 and 11, flexible circuit assembly 622 includes a stiffener 624. Stiffener 624 includes a mount feature 625 and a turnaround feature 626. The mount feature 625 being mounted to arm 620. Mounting portion 610 of flexible cable 600 is mounted to mount feature 625 and turnaround portion 608 of flexible cable 600 is mounted to turnaround feature 626. Therefore, mount feature 625 of stiffener 624 also includes a slot 629 that matches and is aligned with slot 616 in flexible cable 600. Together slot 629 in stiffener 624 and slot 616 in flexible cable 600 accommodate protrusion 644.

As previously discussed in regards to FIG. 9, the mount surface 627 of arm 620 that receives stiffener 624 includes protrusion 644. Although FIG. 9 illustrates protrusion 644 as having a rectangular shape, in FIGS. 10 and 11, protrusion 644 has a cylindrical shape. A sensor 630 is in physical contact with or mounted to protrusion 644 with, for example, an adhesive. When implemented in a data storage system, sensor 630 is configured to sense a zero fly height point for transducing elements in a slider that reads and writes information to a data storage medium. Sensor 630 can be a high frequency shock sensor, acoustic emission sensor or other type of transducer.

As is illustrated in FIGS. 10 and 11, together stiffener 624 and flexible cable 600 are mounted to mount surface 627 of arm 620 such that slot 616 and slot 629 accommodates protrusion 644. Sensor 630 is positioned in physical contact with protrusion 644 by mounting sensor 630 to mounting portion 610 of flexible cable 600 on the edges of slot 616 as illustrated.

Coil tail 614 is coupled to turnaround portion 608 in proximity to service loop portion 606. In the embodiment illustrated, coil tail 614 wraps around the exterior of turnaround feature 626 of stiffener 626 to connect to the voice coil motor (not illustrated in FIGS. 10 and 11).

Figure 12:
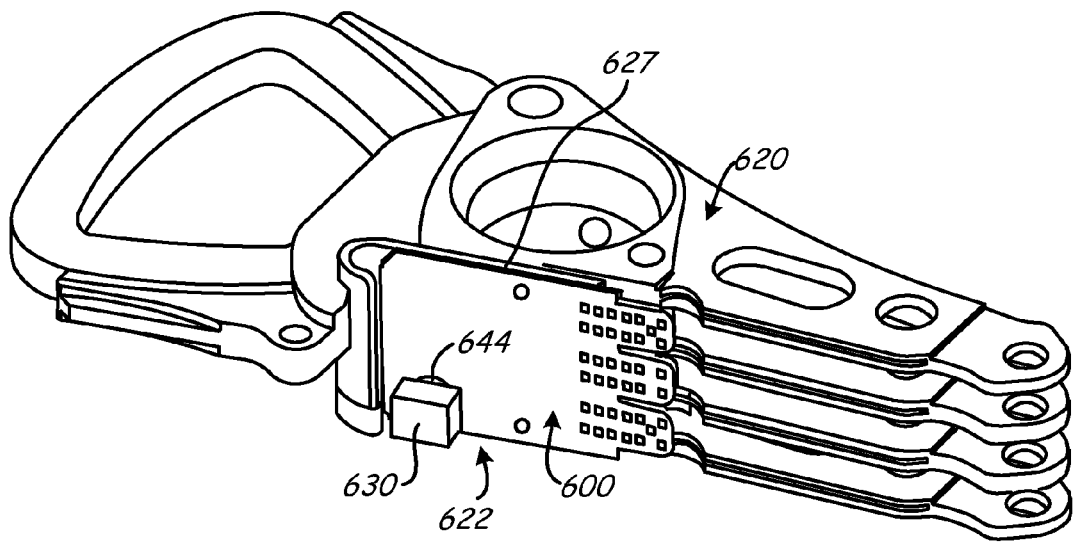
FIG. 12 is a top perspective view of the arm illustrated in FIG. 9 including a portion of the flexible circuit assembly.

FIG. 12 is a top perspective view of arm 620 illustrated in FIG. 9 including a portion of the flexible circuit assembly 622. In FIG. 12, sensor 630 is illustrated as being mounted to flexible cable 600, which is mounted to stiffener 624. Together flexible cable 600 and stiffener 624 are mounted to mount surface 627 of arm 620. In this position, sensor 630 is in physical contact with arm 620 such that zero fly height measurements of a read/write head in a data storage system can be made. In addition, sensor 630 is electrically coupled to the flexible cable 600 for signal processing.

Figure 13:
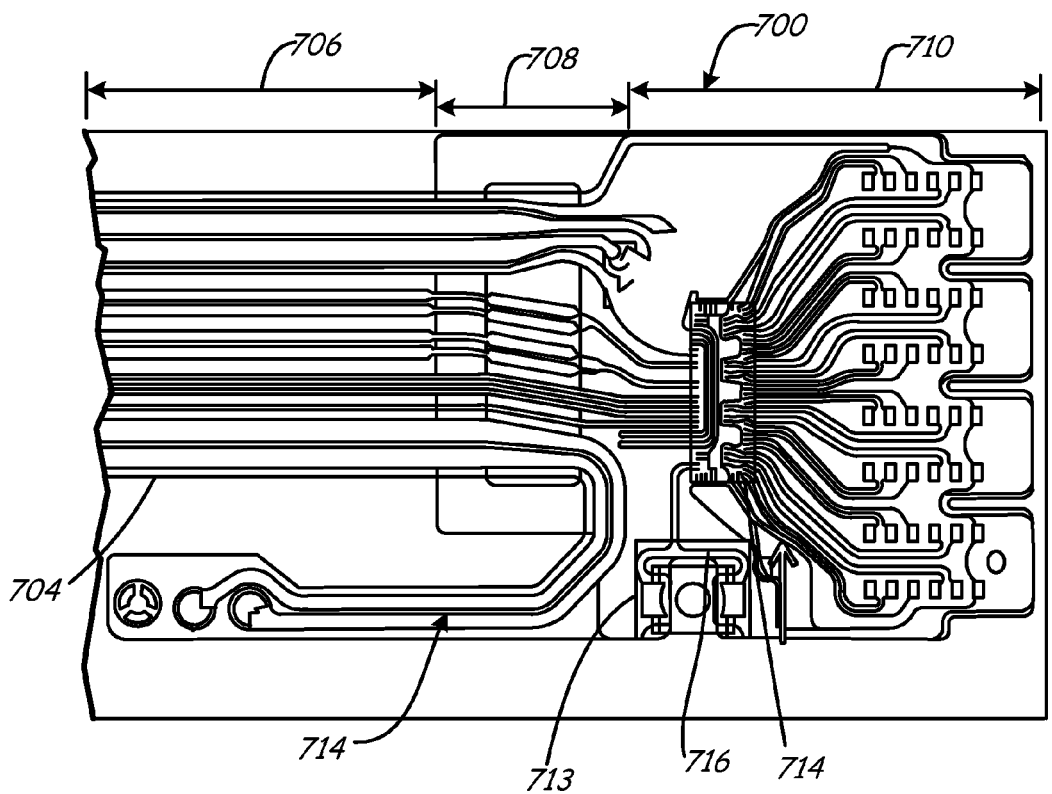
FIG. 13 is a plan view of a flexible cable of a flexible circuit assembly under yet another embodiment.

FIG. 13 is a plan view of a flexible cable 700 of a flexible circuit assembly under yet another embodiment. Flexible cable 700 includes a service loop portion 706, a turnaround portion 708, a mounting portion 710, a signal processing component 714 electrically coupled to mounting portion 710 and a coil tail 714. In the embodiment illustrated in FIG. 13, the polymeric carrier 704 of mounting portion 710 includes a sensor receiving portion 716 for accommodating a portion of an arm that protrudes from its mount surface for mounting a sensor. In a data storage system, the sensor is used for measuring a zero fly height point of transducing element in a slider. In the FIG. 13 embodiment, sensor receiving portion 716 is a slot. Slot 716 includes three side edges of the polymeric carrier 704 of mounting portion 710. At least two of the three side edges of polymeric carrier 704 have traces that are configured for electrically coupling to the sensor by, for example, solder.

The polymeric carrier 704 that encompasses coil tail 714 is coupled to the polymeric carrier 704 of the turnaround portion 608 in proximity to where mounting portion 710 couples to turnaround portion 708. It should be realized that this configuration is different than other embodiments. In this configuration, there is enough room in mounting portion 710 to accommodate both coil tail 714 as well as slot 716.

The flexible cable 700 illustrated in FIG. 13 is configured to include a pre-mounted sensor. Therefore, flexible cable 700 includes an adhesive pull back region 713 located on two of the three sides of the polymeric carrier 704. Adhesive pull back region or adhesive-free region 713 under electrical contacts on flexible cable 700 allows a ridge or protrusion (as will be discussed in detail below) to push up the sensor to achieve a degree of preloading force and strain relief between the sensor and the arm when the sensor and flexible cable are mounted to the arm, without risk of distorting or tearing the polymeric carrier 704.

Figure 14:
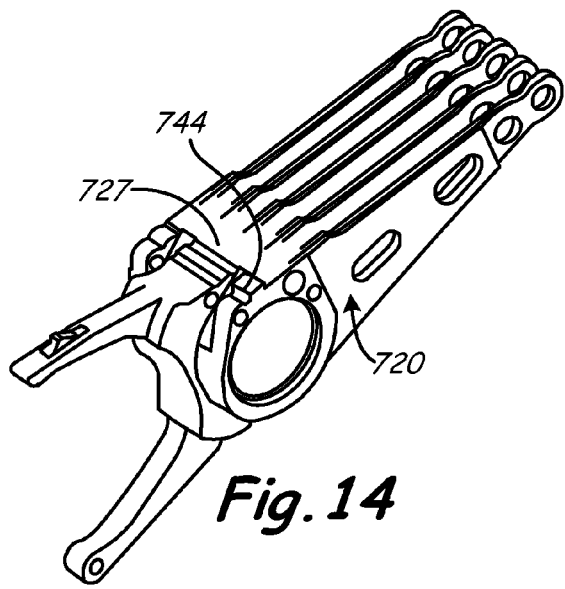
FIG. 14 is a perspective view of an embodiment of an arm configured to receive the flexible cable illustrated in FIG. 13.
Figure 15:
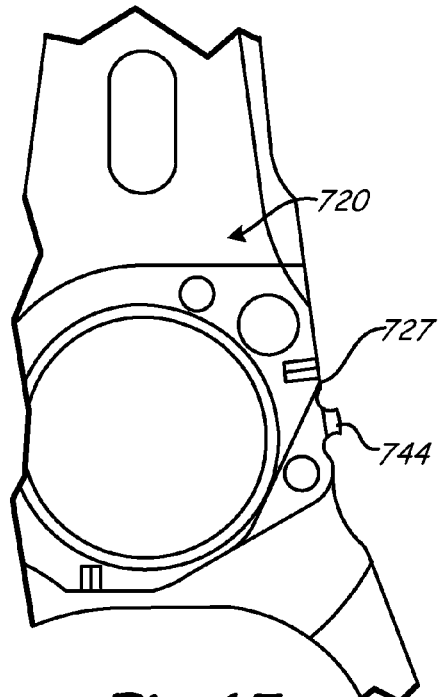
FIG. 15 is a plan view of a portion of the arm illustrated in FIG. 14.

FIG. 14 is a perspective view of an embodiment of an arm 720 configured to receive the flexible cable 700 illustrated in FIG. 13. FIG. 15 is a plan view of a portion of the arm 720 illustrated in FIG. 14. Arm 720 is configured to receive a flexible circuit assembly including the flexible cable 700 illustrated in FIG. 13. As illustrated in FIGS. 14 and 15, arm 720 includes a mount surface 727 that is configured to receive a flexible circuit assembly (illustrated for example in FIGS. 16 and 17). Arm 720 includes a protrusion 744 that protrudes from mount surface 727. As illustrated in FIGS. 14 and 15, protrusion 744 has a rectangular shape. However, it should be realized that any type of geometrically shaped protrusion that protrudes from mount surface 727 is possible.

Figure 16:
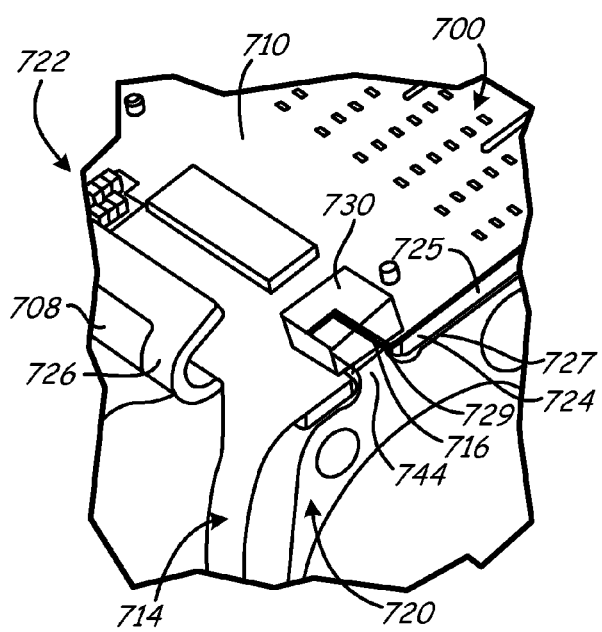
FIG. 16 is a perspective view of a portion of the arm illustrated in FIG. 14 and a flexible circuit assembly including the flexible cable of the embodiment illustrated in FIG. 13.
Figure 17:
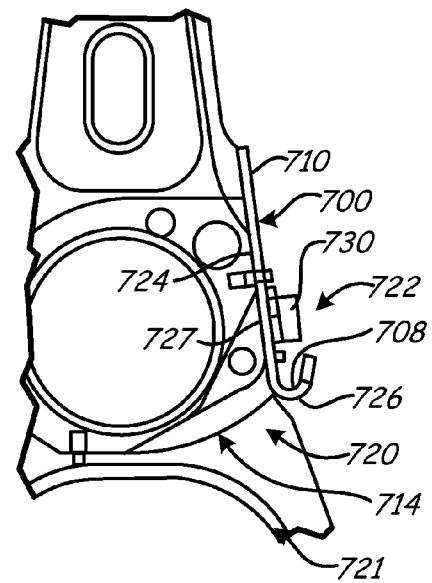
FIG. 17 is a plan view of a portion of the arm illustrated in FIG. 14 and the flexible circuit assembly illustrated in FIG. 16.

FIG. 16 is a perspective view of a portion of arm 720 illustrated in FIG. 14 and a flexible circuit assembly 722 including the flexible cable 700 of FIG. 13. FIG. 17 is a plan view of a portion of arm 720 illustrated in FIG. 14 and the flexible circuit assembly 722 illustrated in FIG. 16.

As illustrated in FIGS. 16 and 17, flexible circuit assembly 722 includes a stiffener 724. Stiffener 724 includes a mount feature 725 and a turnaround feature 726. The mount feature 725 being mounted to arm 720. Mounting portion 710 of flexible cable 700 is mounted to mount feature 725 and turnaround portion 708 of flexible cable 700 is mounted to turnaround feature 726. Therefore, mount feature 725 of stiffener 724 also includes a slot 729 that matches and is aligned with slot 716 in flexible cable 700. Together slot 729 in stiffener 724 and slot 716 in flexible cable 700 accommodate protrusion 744.

As previously discussed in regards to FIG. 14, the mount surface 727 of arm 720 that receives stiffener 724 includes protrusion 744. As illustrated, a sensor 730 pre-mounted to flexible circuit assembly 722 is pushed by and mounted to protrusion 744 by, for example, an adhesive. When implemented in a data storage system, sensor 730 is configured to sense a zero fly height point of transducing element in a slider that reads and writes information to a data storage medium. Sensor 730 can be a high frequency shock sensor, acoustic emission sensor or other type of transducer.

As is illustrated in FIGS. 16 and 17, together stiffener 724 and the mounting portion 710 of flexible cable 700 are mounted to mount surface 727 of arm 720 such that slot 716 and slot 729 accommodates protrusion 744. Sensor 730 is positioned on protrusion 744 by mounting sensor 730 to flexible cable 700 on the edges of slot 616 as illustrated.

Coil tail 714 is coupled to mounting portion 710 in proximity to turnaround portion 708. In the embodiment illustrated, coil tail 714 separately extends from turnaround portion 708 and connects to the voice coil motor 721 (FIG. 17).

It is to be understood that even though numerous characteristics and advantages of various embodiments have been set forth in the foregoing description, together with details of the structure and function of various embodiments, this disclosure is illustrative only, and changes may be made in detail, especially in matters of structure and arrangement of parts within the principles of the disclosure to the full extent indicated by the broad general meaning of the terms in which the appended claims are expressed. For example, the particular elements may vary depending on components in an electronic enclosure should be secured while maintaining substantially the same functionality without departing from the scope and spirit of the present invention. In addition, although the preferred embodiments described herein are directed to securing storage media components, it will be appreciated by those skilled in the art that the teachings of the present invention can be applied to other components of other types of electronic devices, without departing from the scope and spirit of the present invention.

What is claimed is:

1. An actuator for supporting data transfer elements comprising:
   an arm;
   a sensor in contact with a surface of the arm;
   a flexible circuit assembly comprising:
      a stiffener including a mount feature for mounting to the arm and a turnaround feature coupled to the mount feature, the mount feature including a first opening; and
      a flexible cable having a plurality of conductive traces for electrically connecting the data transfer elements to circuitry, the flexible cable including a service loop portion, a mounting portion mounted to the mount feature of the stiffener, a turnaround portion mounted to the turnaround feature of the stiffener and configured for coupling the mounting portion to the service loop portion, wherein the flexible cable includes a sensor receiving portion that includes a second opening for electrically coupling to the sensor;

wherein the first opening in the mount feature of the stiffener and the second opening in the flexible cable are aligned together when the flexible cable is mounted to the stiffener such that the sensor is both in contact with the surface of the arm and electrically coupled to the flexible cable at the sensor receiving portion.

2. The actuator of claim 1, wherein the flexible circuit assembly further comprises a preamplifier mounted to the flexible cable and configured to amplify a signal from the data transfer elements, wherein the preamplifier is electrically coupled to the sensor to process signals from the sensor.

3. The actuator of claim 2, wherein the flexible cable further comprises a sensor tail that separately extends from the turnaround portion and couples to the sensor, the sensor tail including traces for electrically coupling the sensor to the preamplifier.

4. The actuator of claim 1, wherein the first opening comprises a first slot and the second opening comprises a second slot, the first and second slots receivingly engage the sensor in electrical connection with the flexible cable.

5. The actuator of claim 1, wherein the first opening comprises a first aperture and the second opening comprises a second aperture, the first and second apertures receivingly engage the sensor in electrical connection with the flexible cable.

6. The actuator of claim 1, wherein the first opening comprises a first slot and the second opening comprises a second slot, the first and second slots accommodate a protrusion that protrudes from the arm, the sensor is configured to mount to the flexible cable on top of the aligned first and second slots and placed in contact with the protrusion of the arm through the slots.

7. A flexible circuit assembly comprising:
a flexible cable having a plurality of conductive traces for electrically connecting data transfer elements to circuitry, the flexible cable configured for attachment to an arm that supports the data transfer elements and comprising:
a service loop portion;
a mounting portion;
a turnaround portion coupling the mounting portion to the service loop portion;
a sensor tail separately extending from the turnaround portion of the flexible cable and including conductive traces;
a signal processing component mounted to the mounting portion of the flexible cable; and
wherein the sensor tail of the flexible cable electrically couples a sensor to the signal processing component while the sensor is in contact with a surface of the arm.

8. The flexible circuit assembly of claim 7, wherein the flexible cable further comprises a coil tail that separately extends from the turnaround portion and includes traces for electrically coupling a motor that operates the arm.

9. The flexible circuit assembly of claim 8, wherein the coil tail is coupled to the turnaround portion of the flexible cable in proximity to where the turnaround portion couples to the service loop portion.

10. The flexible circuit assembly of claim 8, wherein the coil tail is coupled to the turnaround portion of the flexible cable in proximity to where the turnaround portion couples to the mounting portion.

11. The flexible circuit assembly of claim 7, wherein the sensor tail is coupled to the turnaround portion of the flexible cable in proximity to where the turnaround portion couples to the mounting portion.

12. The flexible circuit assembly of claim 7, wherein the sensor is pre-mounted to the sensor tail of the flexible cable before the sensor is operably put into contact with the surface of the arm.

13. The flexible circuit assembly of claim 7, further comprising a stiffener having a mount feature for receiving the mounting portion of the flexible cable and configured to mount on a mount surface of the arm and a turnaround feature for receiving the turnaround portion of the flexible cable.

14. A method of routing a flexible circuit assembly comprising:
obtaining a stiffener including a mount feature for mounting to an arm and a turnaround feature;
obtaining a flexible cable having a plurality of conductive traces for electrically connecting data transfer elements to circuitry, the flexible cable including a service loop portion, a mounting portion for mounting to the mount feature of the stiffener and a turnaround portion coupling the mounting portion to the service loop portion and mounted to the turnaround feature of the stiffener; and
forming a sensor receiving portion in the mounting portion of the flexible cable for electrically coupling to a sensor that is in contact with the arm, wherein the sensor receiving portion comprises an opening in the mounting portion of the flexible cable such that edges of the opening are in contact with the sensor while the sensor is in contact with the arm.

15. An actuator for supporting data transfer elements comprising:
an arm;
a sensor in physical contact with a surface of the arm creating output signals related to perturbations imparted to the arm; and
a flexible cable comprising:
an opening having sensor receiving edges that are physically and electrically in contact with the sensor while the sensor is in physical contact with the surface of the arm;
a preamplifier communicating signals to and from the data transfer elements; and
circuitry transmitting the output signals from the sensor to the preamplifier.

16. The actuator of claim 15, wherein the sensor comprises a shock sensor.

17. The actuator of claim 15, wherein the sensor comprises an acoustic emission sensor.

* * * * *